United States Patent
Miller (12)

(10) Patent No.: US 11,070,188 B2
(45) Date of Patent: Jul. 20, 2021

(54) IMPEDANCE MATCHING

(71) Applicant: BAE SYSTEMS plc, London (GB)

(72) Inventor: Roy Threadgall Miller, Frimely (GB)

(73) Assignee: BAE SYSTEMS PLC, London (GB)

( * ) Notice: Subject to any disclaimer, the term of this patent is extended or adjusted under 35 U.S.C. 154(b) by 0 days.

(21) Appl. No.: 16/980,199

(22) PCT Filed: Mar. 6, 2019

(86) PCT No.: PCT/GB2019/050625
§ 371 (c)(1),
(2) Date: Sep. 11, 2020

(87) PCT Pub. No.: WO2019/175544
PCT Pub. Date: Sep. 19, 2019

(65) Prior Publication Data
US 2021/0021253 A1    Jan. 21, 2021

(30) Foreign Application Priority Data

Mar. 13, 2018 (EP) ..................................... 18275038
Mar. 13, 2018 (GB) ..................................... 1803969

(51) Int. Cl.
*H03H 7/38* (2006.01)

(52) U.S. Cl.
CPC ....... *H03H 7/383* (2013.01); *H03H 2007/386* (2013.01)

(58) Field of Classification Search
CPC .......................... H03H 7/383; H03H 2007/386
See application file for complete search history.

(56) References Cited

U.S. PATENT DOCUMENTS

| 5,065,118 | A | 11/1991 | Collins et al. | |
|---|---|---|---|---|
| 5,077,499 | A | 12/1991 | Oku | |
| 7,212,789 | B2* | 5/2007 | Kuffner | H01P 1/15 333/124 |
| 8,067,997 | B2* | 11/2011 | Melde | H01P 5/04 333/17.3 |
| 8,283,992 | B2* | 10/2012 | McKay | H03F 1/08 333/26 |
| 2004/0104785 | A1* | 6/2004 | Park | H01P 1/185 333/33 |

(Continued)

FOREIGN PATENT DOCUMENTS

| EP | 0246640 A2 | 11/1987 |
|---|---|---|
| EP | 2728759 B1 | 8/2016 |

(Continued)

OTHER PUBLICATIONS

International Preliminary Report on Patentability received for PCT Application No. PCT/GB2019/050625, dated Sep. 24, 2020. 14 pages.

(Continued)

*Primary Examiner* — Dinh T Le
(74) *Attorney, Agent, or Firm* — Finch & Maloney PLLC

(57) ABSTRACT

Disclosed is an impedance matcher for use in a communication system, operable to match a transmitter or receiver, respectively, to an associated antenna, comprising a stub matching circuit and a phase shifter, whereby, in use, energy flows from a source to the phase shifter, to the stub matching circuit and to a load.

20 Claims, 3 Drawing Sheets

(56) References Cited

U.S. PATENT DOCUMENTS

| | | |
|---|---|---|
| 2007/0142014 A1 | 6/2007 | Wilcox |
| 2009/0109880 A1 | 4/2009 | Kim et al. |
| 2009/0174499 A1 | 7/2009 | Hiramatsu et al. |
| 2014/0120852 A1* | 5/2014 | Ashizuka ............ H04B 1/0458 455/127.1 |
| 2014/0269449 A1* | 9/2014 | Abramsky ............ H04B 1/525 370/278 |

FOREIGN PATENT DOCUMENTS

| | | |
|---|---|---|
| GB | 925449 A | 5/1963 |
| WO | 2019175544 A1 | 9/2019 |

OTHER PUBLICATIONS

International Search Report and Written Opinion received for PCT Application No. PCT/GB2019/050625, dated Jul. 23, 2019. 18 pages.
GB Search Report under Section 17(5) received for GB Application No. 1803969.3, dated Jul. 26, 2018. 4 pages.
Extended European Search Report received for EP Application No. 18275038.0, dated Jan. 16, 2019. 11 pages.
Partial European Search Report received for EP Application No. 18275038.0, dated Sep. 26, 2018. 14 pages.
Papapolymerou, et al., "Reconfigurable Double-Stub Tuners Using MEMS Switches for Intelligent RF Front-Ends," IEEE Transactions on Microwave Theory and Techniques, vol. 51, No. 1, Jan. 2003. pp. 271-278.

* cited by examiner

IMPEDANCE MATCHING

The present invention relates to circuits and associated techniques for impedance matching i.e. matching the impedance of one circuit to another circuit, with a view to maximising energy transfer between the two.

In practical electrical circuits, it is common for a first (source) circuit to have a first characteristic electrical impedance, and for this first (source) circuit to be connected to a second (sink) circuit, having a second characteristic electrical impedance. In the event that the first and second characteristic impedances are not equal, then a certain proportion of transmitted power will be reflected back from the sink circuit to the source circuit.

In communication systems, it is highly desirable that when two circuits are connected, the characteristic impedances match. Sometimes, this is not possible and a separate impedance matching circuit may provide an interface between the two circuits. Effectively the impedance matching circuit matches itself in both directions i.e. to each of the two circuits to ensure maximal transfer of power.

Examples of situations where impedance matching is important include between a transmitter and an antenna and between an antenna and a receiver.

In the example of a transmitter connected to an antenna, it is desirable to ensure that as much energy from the transmitter is transferred to the antenna as possible. There are two reasons for this. Firstly, it is desirable to ensure that maximum energy is transmitted to ensure that a distant receiver receives sufficient energy to receive and decode the transmitted signal. Secondly, in the event of an impedance mismatch, a significant amount of energy may be reflected back into the output stage of a transceiver, (a transmitter with an associated receiver), which could damage it. The receiver part of a transceiver is configured to receive much smaller signal levels than those associated with the transmitter part and so ensuring that as little energy as possible is reflected back into the receiver part during a transmission cycle is important.

In the case of a receiver, the input to the receiver typically needs to receive as much energy from a transmitted signal as possible. As such, it is desirable to ensure that a receive antenna is impedance matched to the input stage of the receiver. In this way, maximum energy from the antenna reaches the receiver, boosting the chances of successfully receiving and decoding the transmitted signal.

There are various prior art techniques employed to provide impedance matching in practical circuits. These can include transformers, resistive networks, stepped transmission lines, filters and stubs.

Each of the prior art techniques has particular advantages and disadvantages. It is an aim of embodiments of the present invention to address such concerns and/or to provide an alternative form of impedance matching circuit.

According to the present invention there is provided an apparatus and method as set forth in the appended claims. Other features of the invention will be apparent from the dependent claims, and the description which follows.

According to the invention, there is provided an impedance matcher for use in a communication system, operable to match a transmitter or receiver, respectively, to an associated antenna, comprising a stub matching circuit and a phase shifter, whereby, in use, energy flows from a source to the phase shifter, to the stub matching circuit and to an electrical load. The load is the antenna in a transmit configuration and a receiver in a receive configuration.

In an embodiment used with a receiver, energy is arranged to flow from the antenna to the phase shifter, to the stub matching circuit, and to the receiver.

In an embodiment used with a transmitter, energy is arranged to flow from the transmitter, to the phase shifter, to the stub matching circuit, and to the antenna.

In an embodiment, the stub matching circuitry comprises either a single stub matching circuit or a double stub matching circuit.

In an embodiment, the single or double stub matching circuit is either open or closed circuit.

In an embodiment, the stub matching circuit is a double stub matching circuit comprising two short circuit stubs.

In an embodiment, there is provided a transceiver comprising a first impedance matcher for a receive chain, and a second impedance matcher for a transmit chain.

In an embodiment, there is provided a phase shifter controller operable to supply each phase shifter with a signal indicative of a channel.

For a better understanding of the invention, and to show how embodiments of the same may be carried into effect, reference will now be made, by way of example, to the accompanying diagrammatic drawings in which.

Figure 1:
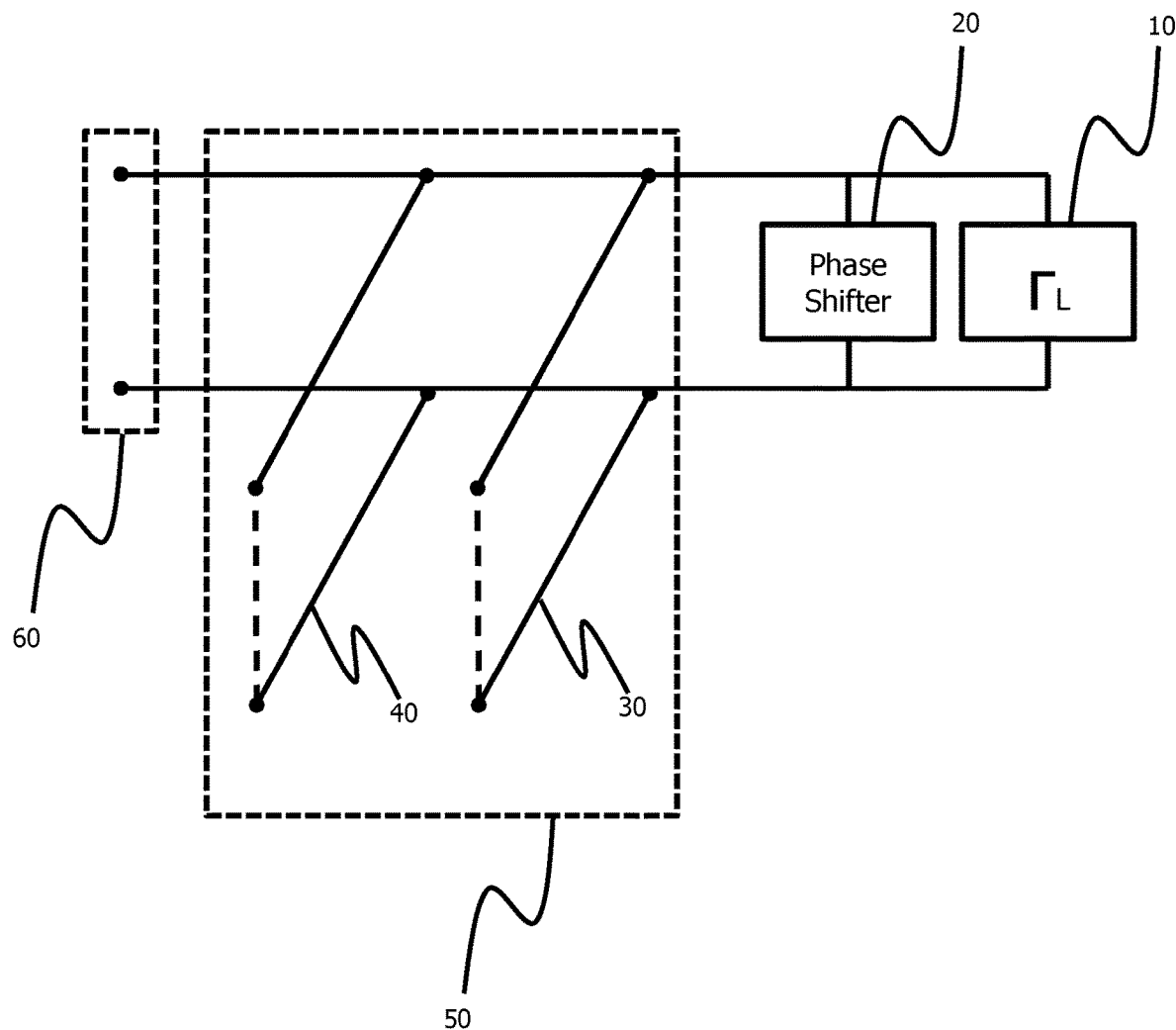
FIG. 1 represents an impedance matching circuit in a receiver according to an embodiment of the present invention.

FIG. 1 shows an embodiment of the present invention. It comprises a double stub matching circuit 50, comprising a first stub 30 and a second stub 40. These stubs are known from the prior art and can take any suitable form, depending on the form of the circuit in question and taking into account factors such as frequency of operation. In a typical configuration, each stub can take the form of a defined length of conductor, such as coaxial cable. The length and other characteristics (e.g. open or short circuit) can be manipulated in a known way.

The particular configuration shown in FIG. 1, i.e. a double stub with two short circuit stubs, is particularly useful in a marine environment, as it allows the physical location of the stub circuitry, in relation to the physical location of the antenna, to be adapted as required and can obviate the need to install the stub circuitry 50 in an awkward or inconvenient location, such as a hard-to-access compartment on a ship. A single stub configuration may also be used, but this offers less adaptability.

Short circuit stubs 30, 40 are selected so that the stubs themselves do not radiate.

However, a double stub matching circuit 50, as known in the prior art, is useful to match a single frequency or a relatively small range of frequencies. It is often less useful or completely unsuitable if it is required to match a relatively broad range of frequencies.

As a particular example, consider the following scenario. On a marine vessel, there is very limited physical real estate for siting and installing antennas. There are often different communication or navigation systems, each requiring their own antennas. Often, these antennas need to be physically separated to avoid interference and ensure proper operation.

Due to these and other constraints, it can be desirable to re-use antennas for multiple systems. However, since each antenna is matched to a particular system, operating with a particular range of frequencies, some form of impedance matching may be required, which can be problematic if, as stated previously, a relatively broad range of frequencies is to be matched.

In a system known as Television White Space (TVWS), frequency spectra which have been freed up by the switching off of analogue television systems may be reutilised by other systems. This is desirable for use on marine vessels, but there is often no, or limited, free space to install a new antenna. Instead, it is often desirable to share an antenna with another on-board service or simply re-purpose an existing antenna. However, this requires impedance matching beyond the capabilities of a prior art matching circuit.

By incorporating a phase shifter 20 between the double stub matching circuit 50 and the load 10, it is possible to manipulate the effective reflection coefficient $\Gamma_{L(\phi)}$ of the load impedance before it arrives at the double stub matching circuit 50. In particular, the phase shifter affects the phase element only (or substantially), without affecting the magnitude of the reflection coefficient. The phase shifter 20 can be a custom-designed device or it can take the form of an off the shelf package. Suitable devices for use in embodiments of the present invention include the following devices: RFPSHT0001D6 provided by RF Lambda; PE82P5000 provided by Pasternak; and DPS-00650155-180-8-IF-IF provided by L3 NARDA-MITEQ. Other devices may be available and these are exemplary only.

In the context of TVWS, which includes e.g. 28 frequency-spaced channels, one of the channels is selected as the basis for the double stub matching circuit 50 to operate without the need for the phase shifter 20. This channel is referred to as channel m. It may be considered as the base channel and is the frequency at which the double stub matcher 50 will naturally achieve optimal results. Channel m may be any one of the available channels. Other TVWS schemes in different countries may have a different number of channels.

The phase shifter 20 then operates to manipulate the reflection coefficient $\Gamma_{L(\phi)}$ of the other 27 channels so that their reflection coefficient $\Gamma_{L(\phi)}$ into the matching circuit matches that of channel m. In this way, any time one of the other 27 channels is selected for use, the phase shifter 20 operates to apply the required phase shift $\phi_{n2}$, which is equal to the original phase of the required channel $\phi_{n1}$ minus the phase of the original, matched channel $\phi_m$, as shown in equation (1) below:

$$\phi_{n2} = \phi_{n1} - \phi_m \quad (1)$$

In this way, all of the channels possess the same phase as channel m and the matching circuit 50 is thus compatible with all 28 channels, in terms of $\Gamma_{L(\phi)}$ only. For channel m, the phase shifter 20 is set to provide a zero phase shift.

The phase shifter 20 is controlled by a controller such that upon a particular channel being selected for use, the phase shifter is configured to provide a phase shift associated with that channel or frequency.

In order to achieve an ideal match, it would be necessary to adjust both the phase and the magnitude of the signal for each channel. However, it is found that by adjusting the phase only, the result is acceptable in practical situations. This feature adjusting the phase only renders embodiments of the invention easily deployable in practice and can operate across a sufficiently broad range of frequencies to be useful in real-life scenarios.

The concept underlying the circuit shown in FIG. 1 is generally applicable to both receivers and transmitters. However, the relative position of stub circuitry 50 and phase shifter 20 are adjusted depending on whether the system in question is a transmitter or receiver. In general, the energy flow passes through components in the order: source to phase-shifter, to stub circuitry, to load.

For use in a receiver, as shown in FIG. 1, the antenna 10 receives an incoming signal. The phase shifter 20 is positioned between the antenna 10 (the source in this case) and the double stub matching circuit 50. The receiver circuitry would be connected at connector 60. The energy flow is from the antenna 10 to the phase shifter 20 to the stub circuitry 50 to the receiver.

Figure 2:
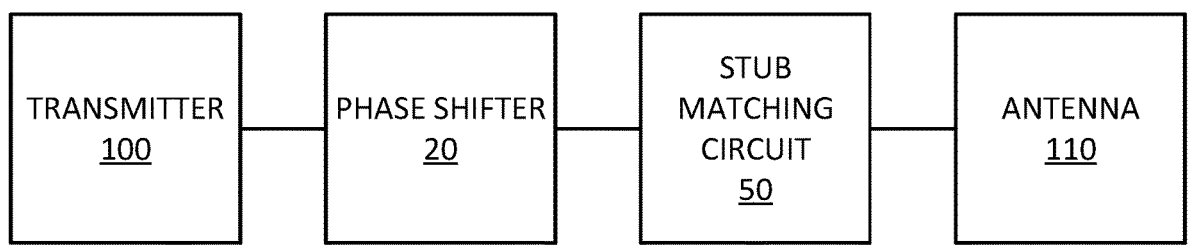
FIG. 2 represents an impedance matching circuit in a transmitter according to an embodiment of the present invention.

FIG. 2 shows the corresponding configuration for a transmitter. The energy flow follows the same 'path' as for the receiver described above. The source is the transmitter 100, from where the energy flows to the phase shifter 20, then onto stub circuitry 50 and then is transmitted via antenna 110.

The difference in use in a receiver or transmitter scenario concerns the relative direction of energy flow, as well as the relative magnitudes of the signals involved. In the case of operation in a receiver, the amount of energy flowing from the antenna 10 to the double stub matching circuit 50 via the phase shifter 20, is significantly smaller than the energy flow in the transmitter system shown in FIG. 2.

The configurations shown in FIGS. 1 and 2 relate to receivers and transmitters respectively. In a practical system, there will typically be a transceiver (a transmitter and receiver) sharing a single antenna. This can be achieved in a known way e.g. using a duplexer or other technique which protects the receiver during a transmit operation.

In such a system, the transmit chain and receive chain will have separate phase shifters 20 and stub circuits 50, since it would be impractical to share them. In particular, the phase shifter 20 is required to deal with powers of vastly different magnitudes in a transmit scenario compared to a receive scenario.

Figure 3:
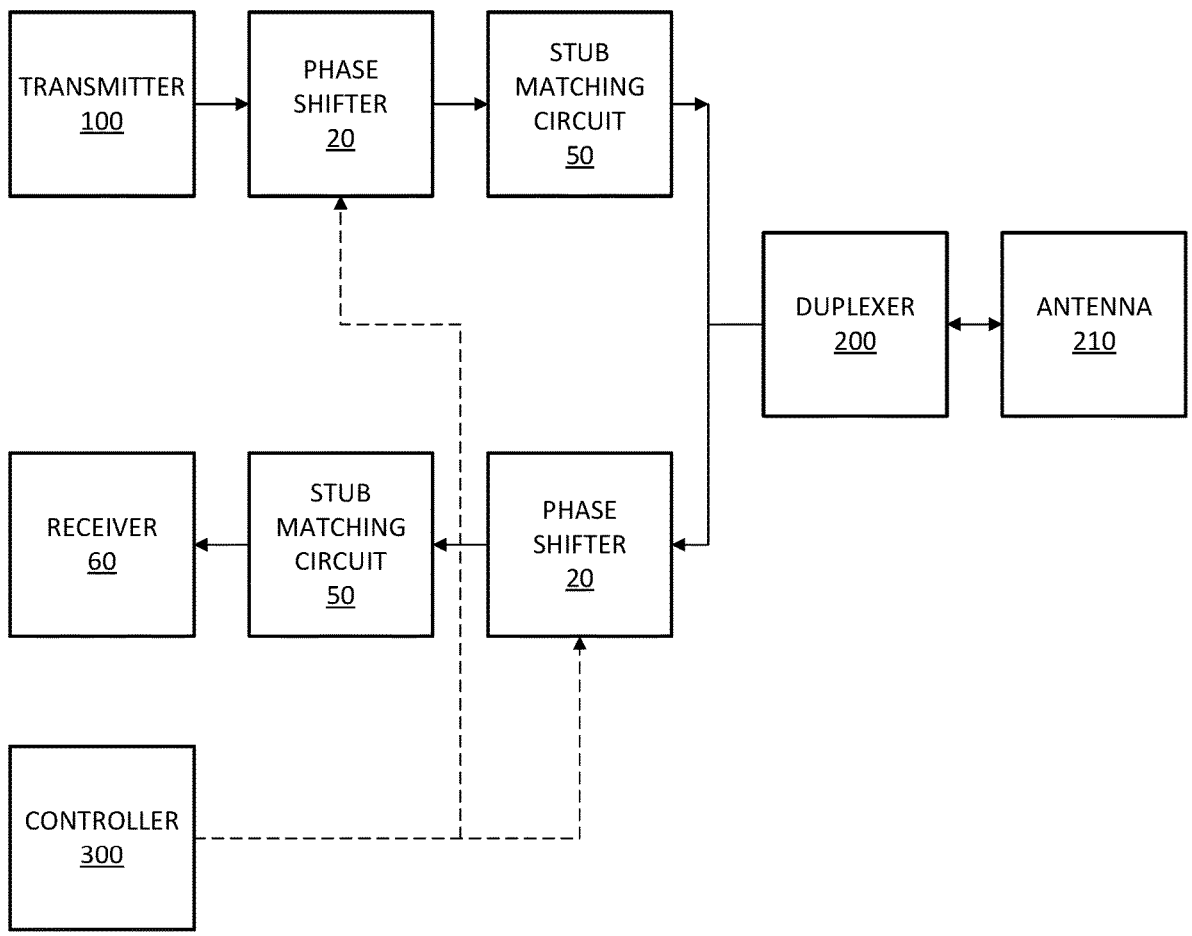
FIG. 3 represents a transceiver comprising impedance matchers for the receive and transmit chains.

FIG. 3 shows a transceiver system employing an impedance matching arrangement according to an embodiment of the present invention. The transceiver includes a transmit chain 100, 20, 50, a receive chain 60, 50, 20, a duplexer 200 and a common antenna 210. There is also shown a controller 300.

The receive chain and transmit chain operate as set out previously. Each is connected to a duplexer 200, which is operable to ensure that only one of the receive chain and transmit chain is connected to the antenna at any given time.

There are a number of different ways to implement such a function and the skilled person will be aware of an appropriate option for any given scenario.

The antenna 210 is a shared antenna, used for transmitting and receiving. It may further be shared with another service, as described previously.

Also shown in FIG. 3 is a controller 300. This supplies a control signal to both of the phase shifters 20 so that an appropriate phase shift may be applied, dependent on the particular channel in use at that time. The controller 300 may be an integral part of the transceiver or it may be a stand-alone device, which receives channel information from the transceiver. The signal supplied from the controller 300 to the phase shifters may be in the form of a digital signal or an analogue voltage, depending on the particular configuration of phase shifter employed. The channel number may be used to retrieve a control signal value from a look up table, with the retrieved control signal being supplied as required.

Embodiments of the invention are operable to make use of limited facilities, for example on a maritime vessel, with minimal adaptation of the existing equipment.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A transceiver comprising:
a first impedance matcher configured to match an impedance between a receiver and an antenna, the first impedance matcher comprising a first stub matching circuit and a first phase shifter;
a second impedance matcher configured to match an impedance between a transmitter and the antenna, the second impedance matcher comprising a second stub matching circuit and a second phase shifter; and
a phase shifter controller coupled to the first phase shifter and the second phase shifter, the phase shifter controller being configured to adjust a phase of the first phase shifter or a phase of the second phase shifter using a signal indicative of a channel, wherein the channel is one frequency-spaced channel of a plurality of frequency-spaced channels and is associated with a signal received by the antenna or a signal transmitted by the transmitter.

2. The transceiver of claim 1, wherein the first phase shifter is coupled between the first stub-matching circuit and the antenna, and wherein the second phase shifter is coupled between the second stub-matching circuit and the transmitter.

3. The transceiver of claim 2, wherein energy is arranged to flow from the transmitter to the second phase shifter, from the second phase shifter to the second stub matching circuit, and from the second stub matching circuit to the antenna.

4. The transceiver of claim 1, wherein the first and/or second stub matching circuit comprises either a single stub matching circuit or a double stub matching circuit.

5. The transceiver of claim 4, wherein the single or double stub matching circuit is either an open or closed circuit.

6. The transceiver of claim 5, wherein the first and/or second stub matching circuit is a double stub matching circuit comprising two short circuit stubs.

7. The transceiver of claim 2, wherein energy is arranged to flow from the antenna to the first phase shifter, from the first phase shifter to the first stub matching circuit and from the first stub matching circuit to the receiver.

8. The transceiver of claim 1, wherein the phase shifter controller is configured to retrieve a value for the signal indicative of the frequency-spaced channel from a look up table based on the frequency-spaced channel.

9. An impedance matching apparatus comprising:
an impedance matcher configured to match an impedance between a transmitter and an antenna, the impedance matcher comprising a stub matching circuit and a phase shifter; and
a controller coupled to the phase shifter and configured to adjust a phase of the phase shifter using a signal indicative of a channel, wherein the channel is one frequency-spaced channel of a plurality of frequency-spaced channels and is associated with a signal transmitted by the transmitter.

10. The impedance matching apparatus of claim 9, wherein the phase shifter is coupled between the stub-matching circuit and the transmitter.

11. The impedance matching apparatus of claim 10, wherein energy is arranged to flow from the transmitter to the phase shifter, from the phase shifter to the stub matching circuit, and from the stub matching circuit to the antenna.

12. The impedance matching apparatus of claim 9, wherein the controller is configured to retrieve a value for the signal indicative of the frequency-spaced channel from a look up table based on the frequency-spaced channel.

13. The impedance matching apparatus of claim 9, wherein the stub matching circuit comprises either a single stub matching circuit or a double stub matching circuit.

14. The impedance matching apparatus of claim 13, wherein the single or double stub matching circuit is either an open or closed circuit.

15. An impedance matching apparatus comprising:
an impedance matcher configured to match an impedance between a receiver and an antenna, the impedance matcher comprising a stub matching circuit and a phase shifter; and
a controller coupled to the phase shifter and configured to adjust a phase of the phase shifter using a signal indicative of a channel, wherein the channel is one frequency-spaced channel of a plurality of frequency-spaced channels and is associated with a signal received by the antenna.

16. The impedance matching apparatus of claim 15, wherein the phase shifter is coupled between the stub-matching circuit and the antenna.

17. The impedance matching apparatus of claim 16, wherein energy is arranged to flow from the antenna to the phase shifter, from the phase shifter to the stub matching circuit, and from the stub matching circuit to the receiver.

18. The impedance matching apparatus of claim 15, wherein the controller is configured to retrieve a value for the signal indicative of the frequency-spaced channel from a look up table based on the frequency-spaced channel.

19. The impedance matching apparatus of claim 15, wherein the stub matching circuit comprises either a single stub matching circuit or a double stub matching circuit.

20. The impedance matching apparatus of claim 19, wherein the single or double stub matching circuit is either an open or closed circuit.

* * * * *